(12) United States Patent
Wang et al.

(10) Patent No.: US 7,638,440 B2
(45) Date of Patent: Dec. 29, 2009

(54) METHOD OF DEPOSITING AN AMORPHOUS CARBON FILM FOR ETCH HARDMASK APPLICATION

(75) Inventors: Yuxiang May Wang, Palo Alto, CA (US); Sudha S. R. Rathi, San Jose, CA (US); Michael Chiu Kwan, Sunnyvale, CA (US); Hichem M'Saad, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 872 days.

(21) Appl. No.: 10/799,146

(22) Filed: Mar. 12, 2004

(65) Prior Publication Data

US 2005/0202683 A1 Sep. 15, 2005

(51) Int. Cl.
*H01L 21/31* (2006.01)
*H01L 21/469* (2006.01)

(52) U.S. Cl. ..................................................... 438/778

(58) Field of Classification Search .................. 438/763, 438/628, 689, 778; 257/437
See application file for complete search history.

(56) References Cited

U.S. PATENT DOCUMENTS

| | | | |
|---|---|---|---|
| 4,975,144 A | 12/1990 | Yamazaki et al. |
| 5,022,959 A | 6/1991 | Itoh et al. |
| 5,262,262 A | 11/1993 | Yagi et al. |
| 5,461,003 A | 10/1995 | Havemann et al. |
| 5,674,573 A | 10/1997 | Mitani et al. |
| 5,759,913 A | 6/1998 | Fulford, Jr. et al. |
| 5,789,320 A | 8/1998 | Andricacos et al. |
| 5,830,332 A | 11/1998 | Babich et al. |
| 5,866,920 A | 2/1999 | Matsumoto et al. |
| 5,882,830 A | 3/1999 | Visser et al. |
| 5,900,288 A | 5/1999 | Kuhman et al. |
| 5,930,655 A | 7/1999 | Cooney, III et al. |
| 5,981,000 A | 11/1999 | Grill et al. |
| 5,986,344 A | 11/1999 | Subramanion et al. |
| 5,998,100 A | 12/1999 | Azuma et al. |

(Continued)

FOREIGN PATENT DOCUMENTS

DE 103 28 578 2/2004

(Continued)

OTHER PUBLICATIONS

U.S. Appl. No. 10/768,724, filed Jan. 30, 2004.

(Continued)

*Primary Examiner*—Leonardo Andújar
*Assistant Examiner*—Monica D Harrison
(74) *Attorney, Agent, or Firm*—Patterson & Sheridan (57) ABSTRACT

Methods are provided for depositing amorphous carbon materials. In one aspect, the invention provides a method for processing a substrate including forming a dielectric material layer on a surface of the substrate, depositing an amorphous carbon layer on the dielectric material layer by introducing a processing gas comprises one or more hydrocarbon compounds and an argon carrier gas, and generating a plasma of the processing gas by applying power from a dual-frequency RF source, etching the amorphous carbon layer to form a patterned amorphous carbon layer, and etching feature definitions in the dielectric material layer corresponding to the patterned amorphous carbon layer. The amorphous carbon layer may act as an etch stop, an anti-reflective coating, or both.

28 Claims, 5 Drawing Sheets

U.S. PATENT DOCUMENTS

| | | | |
|---|---|---|---|
| 6,008,140 A | 12/1999 | Ye et al. | |
| 6,030,901 A | 2/2000 | Hopper et al. | |
| 6,035,803 A | 3/2000 | Robles et al. | |
| 6,043,167 A | 3/2000 | Lee et al. | |
| 6,054,379 A | 4/2000 | Yau et al. | |
| 6,057,226 A | 5/2000 | Wong | |
| 6,064,118 A | 5/2000 | Sasaki | |
| 6,066,577 A | 5/2000 | Cooney, III et al. | |
| 6,080,529 A | 6/2000 | Ye et al. | |
| 6,098,568 A | 8/2000 | Raoux et al. | |
| 6,140,224 A | 10/2000 | Lin | |
| 6,140,226 A | 10/2000 | Grill et al. | |
| 6,143,476 A | 11/2000 | Ye et al. | |
| 6,153,935 A | 11/2000 | Edelstein et al. | |
| 6,165,890 A | 12/2000 | Kohl et al. | |
| 6,183,930 B1 | 2/2001 | Ueda et al. | |
| 6,184,572 B1 | 2/2001 | Mountsier et al. | |
| 6,203,898 B1 | 3/2001 | Kohler et al. | |
| 6,211,065 B1 | 4/2001 | Xi et al. | |
| 6,214,637 B1 | 4/2001 | Kim et al. | |
| 6,214,730 B1 | 4/2001 | Cooney, III et al. | |
| 6,235,629 B1 | 5/2001 | Takenaka | |
| 6,291,334 B1 | 9/2001 | Somekh | |
| 6,316,347 B1 | 11/2001 | Chang et al. | |
| 6,323,119 B1 | 11/2001 | Xi et al. | |
| 6,331,380 B1 | 12/2001 | Ye et al. | |
| 6,333,255 B1 | 12/2001 | Sekiguchi | |
| 6,346,747 B1 | 2/2002 | Grill et al. | |
| 6,352,922 B1 | 3/2002 | Kim | |
| 6,358,573 B1 | 3/2002 | Raoux et al. | |
| 6,358,804 B2 | 3/2002 | Kobayashi et al. | |
| 6,380,106 B1 | 4/2002 | Lim et al. | |
| 6,395,650 B1* | 5/2002 | Callegari et al. | 438/785 |
| 6,413,852 B1 | 7/2002 | Grill et al. | |
| 6,423,384 B1 | 7/2002 | Khazeni et al. | |
| 6,428,894 B1 | 8/2002 | Babich et al. | |
| 6,458,516 B1 | 10/2002 | Ye et al. | |
| 6,541,397 B1 | 4/2003 | Bencher | |
| 6,541,842 B2 | 4/2003 | Meynen et al. | |
| 6,573,030 B1* | 6/2003 | Fairbairn et al. | 430/323 |
| 6,596,627 B2 | 7/2003 | Mandal | |
| 6,624,064 B1 | 9/2003 | Sahin et al. | |
| 6,635,583 B2 | 10/2003 | Bencher et al. | |
| 6,635,735 B1 | 10/2003 | Zhang et al. | |
| 6,852,647 B2 | 2/2005 | Bencher | |
| 6,853,043 B2* | 2/2005 | Yeh et al. | 257/437 |
| 6,884,733 B1 | 4/2005 | Dakshina-Murthy et al. | |
| 6,913,992 B2* | 7/2005 | Schmitt et al. | 438/628 |
| 2001/0007788 A1 | 7/2001 | Chang et al. | |
| 2002/0001778 A1 | 1/2002 | Latchford et al. | |
| 2002/0086547 A1 | 7/2002 | Mui et al. | |
| 2002/0090794 A1 | 7/2002 | Chang et al. | |
| 2003/0091938 A1 | 5/2003 | Fairbairn et al. | |
| 2004/0023502 A1 | 2/2004 | Tzou et al. | |
| 2004/0038537 A1 | 2/2004 | Liu et al. | |
| 2004/0072430 A1* | 4/2004 | Huang et al. | 438/689 |
| 2004/0166691 A1 | 8/2004 | Nieh et al. | |
| 2004/0180551 A1 | 9/2004 | Biles et al. | |
| 2004/0229470 A1 | 11/2004 | Rui et al. | |

FOREIGN PATENT DOCUMENTS

| | | |
|---|---|---|
| EP | 0 381 109 | 1/1990 |
| EP | 0 901 156 | 3/1999 |
| JP | 09 045633 | 2/1997 |
| JP | 11 026578 | 1/1999 |
| WO | WO 00/05763 | 2/2000 |

OTHER PUBLICATIONS

U.S. Appl. No. 10/800,112, filed Mar. 12, 2004.
U.S. Appl. No. 10/799,147, filed Mar. 12, 2004.
U.S. Appl. No. 10/383,839, filed Mar. 7, 2003.
U.S. Appl. No. 60/565,639, filed on Apr. 26, 2004.
U.S. Appl. No. 60/649,344, filed Feb. 2, 2005.
Liu, "Generating Sub-30nm Poly-Silicon Gates Using PECVD Amorphous Carbon as Hardmask and Anti-Reflective Coating", Proceedings of the SPIE, Bellingham, VA, US, vol. 5040, No. 1, Feb. 25, 2003, pp. 841-848.
PCT Notification of Transmittal of the International Search Report dated May 31, 2005 for PCT/US05/008070.
PCT Written Opinion dated May 31, 2005 for PCT/US05/008070.
PCT International Search Report for PCT/US05/005855 dated Oct. 13, 2005.
PCT Written Opinion for PCT/US05/005855 dated Oct. 13, 2005.
Chinese Office Action dated Sep. 12, 2008 for Chinese Application No. 200580006997.0.
PCT International Preliminary Report on Patentability and Written Opinion for PCT/US2005/005855, dated Sep. 14, 2006.
Office Action for Taiwan Patent Application No. 094106477 dated Jun. 11, 2009.

* cited by examiner

METHOD OF DEPOSITING AN AMORPHOUS CARBON FILM FOR ETCH HARDMASK APPLICATION

BACKGROUND OF THE DISCLOSURE

1. Field of the Invention

The invention relates to the fabrication of integrated circuits and to a process for depositing materials on a substrate and the structures formed by the materials.

2. Description of the Related Art

One of the primary steps in the fabrication of modern semiconductor devices is the formation of metal and dielectric layers on a substrate by chemical reaction of gases. Such deposition processes are referred to as chemical vapor deposition or CVD. Conventional thermal CVD processes supply reactive gases to the substrate surface where energy-induced chemical reactions take place to produce a desired layer.

CVD processes are useful in forming vertical and horizontal interconnects by a damascene or dual damascene method involving the deposition and patterning of one or more material layers. In the damascene method, one or more dielectric materials, such as the low k dielectric materials (i.e., having a dielectric constant (k) <4.0), are deposited and pattern etched to form the vertical interconnects, also known as vias, and horizontal interconnects, also know as lines. Conductive materials, such as copper containing materials, and other materials, such as barrier layer materials used to prevent diffusion of copper containing materials into the surrounding low k dielectric, are then inlaid into the etched pattern. Any excess copper containing materials and excess barrier layer material-external to the etched pattern, such as on the field of the substrate, is then removed.

However, when low k material have been used in damascene formation, it has been difficult to produce features with little or no surface defects or feature deformation. It has been observed that low k dielectric materials are often porous and susceptible to being scratched and damaged during removal of conductive materials, which results in defects being formed on the substrate surface. Further, low k materials are often brittle and may deform under conventional polishing processes. One solution to limiting or reducing surface defects and deformation is to deposit a hardmask over the exposed low k materials prior to patterning and etching feature definitions in the low k materials. The hardmask is resistive to damage and deformation. The hardmask may also protect the underlying low k materials during subsequent material deposition and planarization or material removal processes, such as chemical mechanical polishing techniques or etching techniques, thereby reducing defect formation and feature deformation. The hardmask may then be removed following planarization prior to subsequent processing of the substrate.

Additionally, in the damascene process described above, patterns are formed using conventional lithographic techniques in which a layer of energy sensitive resist is formed over a stack of material layers on a substrate, an image of a pattern is introduced into the energy sensitive resist material, and the pattern introduced into the energy sensitive resist material is transferred into one or more layers of the material stack formed on the substrate using the layer of energy sensitive resist as a mask.

The pattern introduced into the energy sensitive resist can be transferred into one or more layers of the material stack using a chemical etchant. The chemical etchant is designed to have a greater etch selectivity for the material layers of the stack than for the energy sensitive resist. That is, the chemical etchant etches the one or more layers of the material stack at a much faster rate than it etches the energy sensitive resist. The faster etch rate for the one or more material layers of the stack typically prevents the energy sensitive resist material from being consumed prior to completion of the pattern transfer.

As the pattern dimensions are reduced, the thickness of the energy sensitive resist must correspondingly be reduced in order to control pattern resolution. Such thinner resist materials (less than about 6000 Å) can be insufficient to mask underlying material layers during a pattern transfer step using a chemical etchant. A hardmask layer as described above may be used between the energy sensitive resist material and the underlying material layers to facilitate pattern transfer into the underlying material layers. However, in some applications for forming semiconductor structures, it is difficult to remove hardmask materials from the substrate surface and the remaining hardmask material may detrimentally affect semiconductor processing. Further, conventional hardmask materials may not provide sufficient etch selectivity between the material being etched and the hardmask to retain the desired dimensions of the features being formed.

Resist patterning problems are further compounded when lithographic imaging tools having deep ultraviolet (DUV) imaging wavelengths (e. g., less than about 250 nanometers (nm)) are used to generate the resist patterns. The DUV imaging wavelengths improve resist pattern resolution because diffraction effects are reduced at these shorter wavelengths. Additionally, the increased reflective nature of many underlying materials, such as polysilicon, metals, and metal siuicides at such DUV wavelengths, can degrade the resulting resist patterns.

One technique proposed to minimize reflections from an underlying material layer uses an anti-reflective coating (ARC). The ARC is formed over the reflective material layer prior to resist patterning. The ARC suppresses the reflections off the underlying material layer during resist imaging, providing accurate pattern replication in the layer of energy sensitive resist. A number of ARC materials have been suggested for use in combination with energy sensitive resists. However, ARC materials, like hardmask materials are difficult to remove and may leave residues behind that potentially interfere with subsequent integrated circuit fabrication steps.

Therefore, a need exists in the art for a material layer useful for integrated circuit fabrication, which has good etch selectivity and/or anti-reflective properties that may further be removed with little or minimal residues.

SUMMARY OF THE INVENTION

Aspects of the invention generally provide a method for depositing amorphous carbon materials. In one aspect, the invention provides a method for processing a substrate including positioning the substrate in a processing chamber, introducing a processing gas into the processing chamber, wherein the processing gas comprises one or more hydrocarbon compounds and an argon carrier gas, generating a plasma of the processing gas by applying power from a dual-frequency RF source, and depositing an amorphous carbon layer on the substrate.

In another aspect of the invention, a method is provided for processing a substrate including forming a dielectric material layer on a surface of the substrate, depositing one or more amorphous carbon layers on the dielectric material layer by a process comprising introducing a processing gas comprises one or more hydrocarbon compounds and an argon carrier gas, generating a plasma of the processing gas by applying power from a dual-frequency RF source, etching the one or more amorphous carbon layers to form a patterned amorphous carbon layer, and etching feature definitions in the dielectric material layer corresponding to the patterned one or more amorphous carbon layers.

In another aspect of the invention, a method is provided for processing a substrate including depositing one or more dielectric layers on a substrate surface, wherein at least one of the one or more dielectric layers comprise silicon, oxygen, and carbon and has a dielectric constant of about 3 or less, forming one or more amorphous carbon layers on the one or more dielectric layers by a process comprising introducing a processing gas comprises one or more hydrocarbon compounds and an argon carrier gas, generating a plasma of the processing gas by applying power from a dual-frequency RF source, defining a pattern in at least one region of the one or more amorphous carbon layers, forming feature definitions in the one or more dielectric layer by the pattern formed in the at least one region of the one or more amorphous carbon layers and depositing one or more conductive materials in the feature definitions.

BRIEF DESCRIPTION OF THE DRAWINGS

So that the manner in which the above features of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

For a further understanding of aspect of the invention, reference should be made to the ensuing detailed description.

DETAILED DESCRIPTION OF THE PREFERRED EMBODIMENTS

The words and phrases used herein should be given their ordinary and customary meaning in the art by one skilled in the art unless otherwise further defined. Aspects of the invention generally provide methods for depositing, processing, and removing amorphous carbon material. It has been unexpectedly and surprisingly found that amorphous carbon deposition rates and etch selectivity to dielectric materials, such as oxides, may be increased compared to amorphous carbon deposited by conventional amorphous carbon deposition processes by the use of dual frequency RF power sources and the inclusion of argon as a carrier gas in amorphous carbon processing gases.

The following deposition processes are described with use of the 300 mm Producer™ dual deposition station processing chamber, and should be interpreted accordingly, for example, flow rates are total flow rates and should be divided in two to describe the process flow rates at each deposition station in the chamber. Additionally, for single deposition chambers, such as the DxZ processing chamber, commercially available from Applied Materials, Inc., of Santa Clara, Calif., may perform the following process with appropriate process conversions, i.e., adjusting flow rated from total dual deposition station Producer™ processing chamber flow rates to single deposition station flow rates.

An amorphous carbon layer may be deposited by a process including introducing a gas mixture of one or more hydrocarbon compounds into a processing chamber. The hydrocarbon compound has a formula $C_xH_y$, where x has a range of between 2 and 4 and y has a range of between 2 and 10. For example, propylene ($C_3H_6$), propyne ($C_3H_4$), propane ($C_3H_8$), butane ($C_4H_{10}$), butylene ($C_4H_8$), butadiene ($C_4H_6$), or acetylene ($C_2H_2$) as well as combinations thereof, may be used as the hydrocarbon compound.

Alternatively, partially or completely fluorinated derivatives of the hydrocarbon compounds may be used. The doped derivatives include boron-containing derivatives of the hydrocarbon compounds as well as fluorinated derivatives thereof. The fluorinated hydrocarbons compounds have a formula $C_xH_yF_z$, where x has a range of between 2 and 4, y has a range of between 0 and 10, z has a range of between 0 and 10, with y+z greater than or equal to 2 and less than or equal to 10. Examples include fully fluorinated hydrocarbons, such as $C_3F_8$ or $C_4F_8$, which may be used to deposit a fluorinated amorphous carbon layer, which may be described as an amorphous fluorocarbon layer. Additionally, the hydrocarbon compounds may contain nitrogen or be deposited with a nitrogen-containing gas, such as ammonia.

A combination of hydrocarbon compounds and fluorinated derivatives of hydrocarbon compounds may be used to deposit the amorphous carbon layer or amorphous fluorocarbon layer. Alternatively, hydrocarbon compounds, and fluorinated derivatives thereof, including alkanes, alkenes, alkynes, cyclic compounds, and aromatic compounds, having five or more carbons, such as pentane, benzene, and toluene, may be used to deposit amorphous carbon layers.

The processing gas further includes an inert gas, Argon (Ar). Other inert gases, such as nitrogen ($N_2$) or other noble gases, such as helium (He) may also be used. Inert gases may be used to control the density and deposition rate of the amorphous carbon layer. Additionally, a variety of processing gases may be added to the gas mixture to modify properties of the amorphous carbon material. The gases may be reactive gases, such as hydrogen ($H_2$), ammonia ($NH_3$), a mixture of hydrogen ($H_2$) and nitrogen ($N_2$), or combinations thereof. The addition of $H_2$ and/or $NH_3$ can be used to control the hydrogen ratio of the amorphous carbon layer to control layer properties, such as reflectivity. A mixture of reactive gases and inert gases may be added to the processing gas to deposit an amorphous carbon layer.

The amorphous carbon layer may deposited from the processing gas by maintaining a substrate temperature between about 100° C. and about 700° C., such as between about 350° C. and about 550° C., maintaining a chamber pressure between about 1 Torr and about 20 Torr, introducing the hydrocarbon gas ($C_xH_y$), and any inert, or reactive gases respectively, at a flow rate between about 50 sccm and about 2000 sccm for a 200 mm substrate, a plasma is generated by applying a RF power of between about 0.03 W/cm² and about 20 W/cm², or between about 10 watts (W) and about 6000 W, for example between about 0.3 W/cm² and about 3 W/cm², or between about 100 W and about 1000 W for a 200 mm substrate, with a gas distributor being between about 200 mils and about 600 mils from the substrate surface. The above process parameters provide a typical deposition rate for the amorphous carbon layer in the range of about 100 Å/min to about 5000 Å/min. The process can be implemented on a 200 mm substrate in a deposition chamber, such as the Producer™ processing chamber, commercially available from Applied Materials, Inc., of Santa Clara Calif. Other suitable deposition apparatus, such as the DxZ™ processing chamber commercially available from Applied Materials, Inc., of Santa Clara Calif., may be used.

Alternatively, a dual-frequency system may be applied to deposit the amorphous carbon material. A dual-frequency source of mixed RF power provides a high frequency power in a range between about 10 MHz and about 30 MHz, for example, about 13.56 MHz, as well as a low frequency power in a range of between about 100 KHz and about 500 KHz, for example, about 350 KHz. An example of a mixed frequency RF: power application may include a first RF power with a frequency in a range of about 10 MHz and about 30 MHz at a power in a range of about 200 watts to about 800 watts and at least a second RF power with a frequency in a range of between about 100 KHz and about 500 KHz as well as a power in a range of about 1 watt to about 200 watts. The ratio of the second RF power to the total mixed frequency power is preferably less than about 0.6 to 1.0 (0.6:1). The applied RF power and use of one or more frequencies may be varied based upon the substrate size and the equipment used.

The high frequency RF power and the low frequency RF power may be coupled to a gas distributor (showerhead) or a substrate support, or one may be coupled to the showerhead and the other to the support pedestal. Details of the mixed RF power source 119 are described in commonly assigned U.S. Pat. No. 6,041,734, entitled, "Use of an Asymmietric Waveform to Control Ion Bombardment During Substrate Processing", issued on Mar. 28, 2000, and is herein incorporated by reference.

The amorphous carbon layer comprises carbon and hydrogen atoms, which may be an adjustable carbon:hydrogen ratio that ranges from about 10% hydrogen to about 60% hydrogen. Controlling the hydrogen ratio of the amorphous carbon layer is desirable for tuning the respective optical properties, etch selectivity and chemical mechanical polishing resistance properties.

In hardmask applications, as the hydrogen content decreases, the etch resistance, and thus the selectivity, of the amorphous carbon layer increases. The hardmask provides a selectivity, or removal rate ratio, of amorphous carbon to dielectric material of greater than about 1:10, such as greater than 1:10 and less than or equal to 1:20. The reduced rate of removal of the amorphous carbon layer allows for effective dielectric material etch without loss of the amorphous carbon layer which defines the definitions of the features being etched into the conductive material. The amorphous carbon layer deposited by the process herein was observed to have an etch selectivity improvement of between about 5% and about 20% greater than helium deposited amorphous carbon materials.

In anti-reflective coating applications, control of the content of the amorphous carbon layer and the process for depositing the amorphous carbon layer can result in control of anti-reflective coating properties. For example, as the hydrogen content decreases the optical properties of the as-deposited layer such as for example, the index of refraction (n) and the absorption coefficient (k) increase.

The light absorption coefficient, k, of the amorphous carbon layer can be varied between about 0.1 to about 1.0 at wavelengths below about 250 nm, such as between about 193 nm and about 250 nm, making the amorphous carbon layer suitable for use as an anti-reflective coating (ARC) at DUV wavelengths. The absorption coefficient of the amorphous carbon layer can be varied as a function of the deposition temperature. In particular, as the temperature increases the absorption coefficient of the as-deposited layer likewise increases. For example, when propylene is the hydrocarbon compound the k value for the as-deposited amorphous carbon layers can be increased from about 0.2 to about 0.7 by increasing the deposition temperature from about 150° C. to about 480° C. Typically, the amorphous carbon layer has a thickness of about 200 Å to about 1100 Å.

The absorption coefficient of the amorphous carbon layer can also be varied as a function of the additive used in the gas mixture. In particular, the presence of hydrogen ($H_2$), ammonia ($NH_3$), and nitrogen ($N_2$), or combinations thereof, in the gas mixture can increase the k value by about 10% to about 100%. The amorphous carbon layer is further described in U.S. patent Ser. No. 6,573,030, issued on Jun. 3, 2003, entitled, "Method for Depositing an Amorphous Carbon Layer", which is incorporated herein to the extent not inconsistent with the claimed aspects and description herein.

In an alternate embodiment, the amorphous carbon layer can have an absorption coefficient (k) that varies across the thickness of the layer. That is, the amorphous carbon layer can have an absorption coefficient gradient formed therein. Such a gradient is formed as a function of variations of the temperature and the composition of the gas mixture during layer formation.

At any interface between two material layers, reflections can occur because of differences in their refractive indices (n) and absorption coefficients (k). When the amorphous carbon ARC has a gradient, it is possible to match the refractive indices (n) and the absorption coefficients (k) of the two material layers so there is minimal reflection and maximum transmission into the amorphous carbon ARC. Then the refractive index (n) and absorption coefficient (k) of the amorphous carbon ARC can be gradually adjusted to absorb all of the light transmitted therein.

The amorphous carbon layer may be deposited with two or more layers having different optical properties. For example, an amorphous carbon bi-layer may include a first amorphous carbon layer according to the process parameters described above and is designed primarily for light absorption. As such, the first amorphous carbon layer 230 has an index of refraction in the range of about 1.5 to about 1.9 and an absorption coefficient (k) in the range of about 0.5 to about 1.0 at wavelengths less than about 250 nm. A second amorphous carbon layer, an anti-reflective coating layer is formed on the first amorphous carbon layer according to the process parameters described above to have an index of refraction between about 1.5 and about 1.9, and an absorption coefficient between about 0.1 and about 0.5. The second amorphous carbon layer is designed primarily for phase shift cancellation by creating reflections that cancel those generated at the interface with an overlying material layer, such as an energy sensitive resist material, for example, a resist. The refractive index (n) and the absorption coefficient (k) of the first and second amorphous carbon layers are tunable, in that they can be varied as a function of the temperature as well as the composition of the gas mixture during layer formation.

Removal of the amorphous carbon material from the dielectric material may be achieved by subjecting the amorphous carbon layer to a plasma of a hydrogen-containing gas and/or an oxygen-containing gas. The plasma of the hydrogen-containing gas and/or the oxygen-containing gas is believed to remove the amorphous carbon material with minimal effect of the dielectric material disposed thereunder.

The plasma treatment generally includes providing the hydrogen containing gas including hydrogen, ammonia, water vapor ($H_2O$), or combinations thereof, to a processing chamber at a flow rate between about 100 sccm and about 1000 sccm, preferably between about 500 sccm and about 1000 sccm, and generating a plasma in the processing chamber. The plasma may be generated using a power density ranging between about 0.15 W/cm$^2$ and about 5 W/cm$^2$, which is a RF power level of between about 50 W and about 1500 W for a 200 mm substrate. The RF power can be provided at a high frequency such as between 13 MHz and 14 MHz. The RF power can be provided continuously or in short duration cycles wherein the power is on at the stated levels for cycles less than about 200 Hz and the on cycles total between about 10% and about 30% of the total duty cycle.

The plasma treatment may be performed by maintaining a chamber pressure of between about 1 Torr and about 10 Torr, preferably between about 3 Torr and about 8 Torr, maintaining the substrate at a temperature between about 100° C. and about 300° C. during the plasma treatment, preferably, between about 200° C. and about 300° C., for between about 15 seconds and about 120 seconds, or as necessary to remove the amorphous carbon material with the gas distributor positioned between about 100 mils and about 2000 mils from the substrate surface, preferably positioned between about 200 mils and about 1000 mils, during the plasma treatment. However, it should be noted that the respective parameters may be modified to perform the plasma processes in various chambers and for different substrate sizes, such as between 200 mm and 300 mm substrates. Alternatively, the plasma treatment process parameters may be the same or substantially the same as the material deposition process pararmeters.

A suitable reactor for performing the amorphous carbon material deposition and the hydrogen-containing gas plasma removal of the amorphous carbon materials described herein may be performed in a Producer™ processing chamber or a DxZ™ chemical vapor deposition chamber commercially available from Applied Materials, Inc., Santa Clara, Calif.

Hardmask/Anti-Reflective Coating (ARC) Application

Figure 1A:
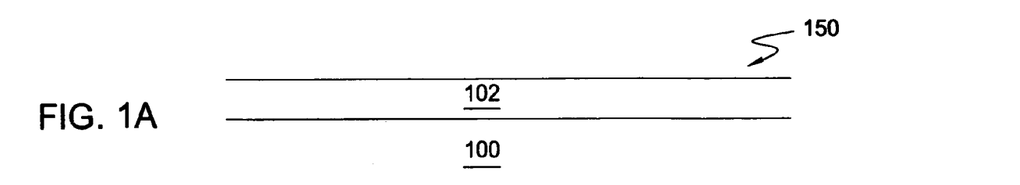
FIGS. 1A-1E are cross sectional views showing one embodiment of one embodiment of an amorphous carbon deposition process according to the invention.

FIGS. 1A-1E illustrate schematic cross-sectional views of one embodiment of a substrate 100 at different stages of an integrated circuit fabrication sequence incorporating an amorphous carbon layer as a hardmask. In general, the substrate 100 refers to any workpiece on which processing is performed, and a substrate structure 150 is used to generally denote the substrate 100 together with other material layers formed on the substrate 100. Depending on the specific stage of processing, the substrate: 100 may correspond to a silicon substrate, or other material layer that has been formed on the substrate. FIG. 1A, for example, illustrates a cross-sectional view of a substrate structure 150, having a material layer 102 that has been conventionally formed thereon. The material layer 102 may be an oxide (e.g., SiO$_2$). In general, the substrate 100 may include a layer of silicon, silicides, metals or other materials.

Figure 1B:
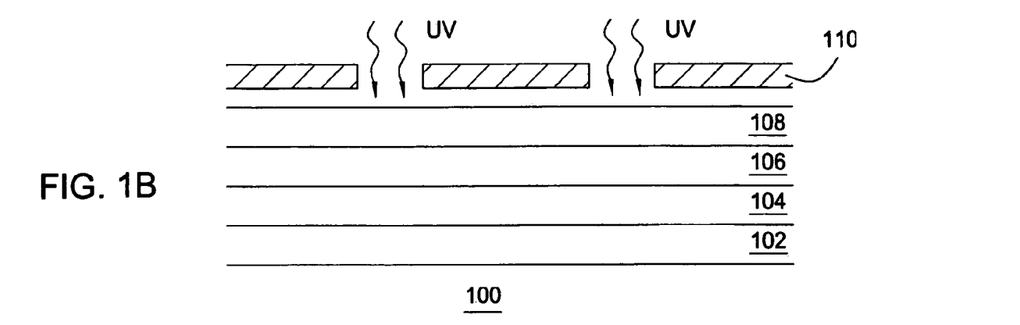

FIG. 1B depicts an amorphous carbon layer 104 deposited on the substrate structure 150 of FIG. 1A. The amorphous carbon layer 104 is formed on the substrate structure 150 according to the process parameters described above. The thickness of the amorphous carbon layer is variable depending on the specific stage of processing. Typically, the amorphous carbon layer has a thickness in the range of about 50 Å to about 1000 Å.

Dependant on the etch chemistry of the energy sensitive resist material used in the fabrication sequence, an optional capping layer 106 may be formed on the amorphous carbon layer 104. The optional capping layer 106 functions as a mask for the amorphous carbon layer 104 when the pattern is transferred therein. The optional capping layer 106 may comprise a material including an oxide, such as silicon oxide, a nitride, such as silicon nitride or titanium nitride, silicon oxynitride, silicon carbide, amorphous silicon, undoped silica-glass (USG), doped silicon oxide, or other materials. The optional capping layer 106 may be deposited to a thickness between about 300Å and about 1000Å, but layer thickness may vary depending on process requirements. The cap layer is believed to protect the amorphous carbon layer from the photoresist as well as cover any layer imperfections, such as pinholes formed in the amorphous carbon material.

A layer of energy sensitive resist material 108 is formed on the optional capping layer 106. The layer of energy sensitive resist material 108 can be spin coated on the substrate to a thickness within the range of about 2000 Å to about 6000 Å. Most energy sensitive resist materials are sensitive to ultraviolet (UV) radiation having a wavelength less than about 450 nm. DUV resist materials are sensitive to UV radiation having wavelengths of 245 nm or 193 nm.

Figure 1C:
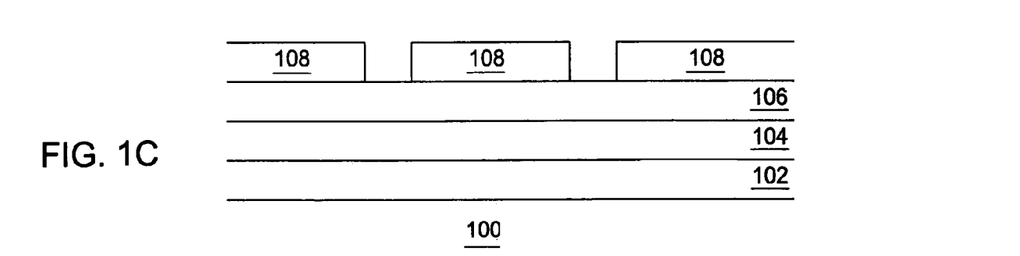

An image of a pattern is introduced into the layer of energy sensitive resist material 108 by exposing such energy sensitive resist material 108 to UV radiation via mask 110. The image of the pattern introduced in the layer of energy sensitive resist material 108 is developed in an appropriate developer to define the pattern through such layer as shown in FIG. 1C.

Figure 1D:
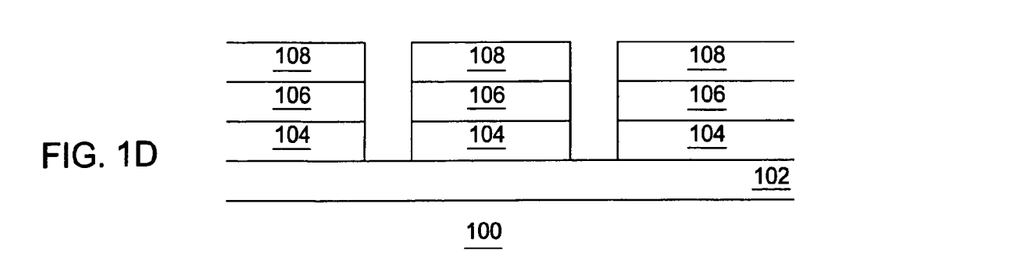
Figure 1E:
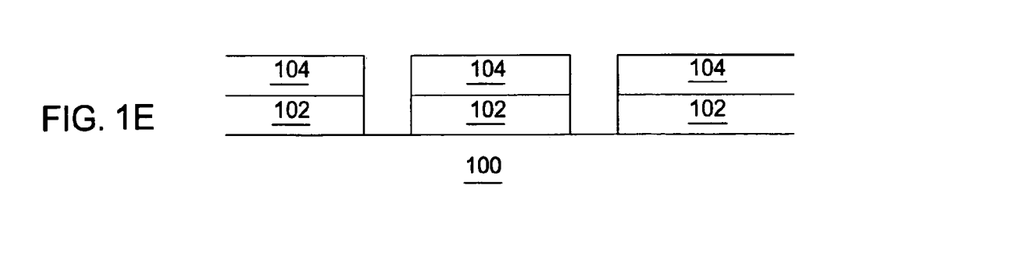

Thereafter, referring to FIG. 1D, the pattern defined in the energy sensitive resist material 108 is transferred through both the optional capping layer 106 and the amorphous carbon layer 104. The pattern is transferred through the optional capping layer 106 using the energy sensitive resist material 108 as a mask. The pattern is transferred through the optional capping layer 106 by etching the optional capping layer 106 using an appropriate chemical etchant. The pattern is then transferred through the amorphous carbon layer 104 using the optional capping layer 106 as a mask, using an appropriate chemical etchant (e. g., ozone, oxygen or ammonia plasmas), and then through the material layer 102 using the amorphous carbon layer 104 as a hardmask as shown in FIG. 1E. After the material layer 102, i.e. silicon dioxide, is patterned, the amorphous carbon layer 104 can optionally be stripped from the substrate 100 as described herein.

In a specific example of a fabrication sequence, the pattern defined in the amorphous carbon hardmask can be incorporated into the structure of the integrated circuit, such as a damascene structure. Damascene structures are typically used to form metal interconnects on integrated circuits.

Conductive Feature Formation

An example of a conductive or dielectric feature formed with amorphous carbon as an etch stop and/or anti-reflective coating (ARC) and the amorphous carbon material removal process described herein is shown in FIGS. 2A-2E, which are cross sectional views of a substrate having the steps of the invention formed thereon.

Figure 2A:
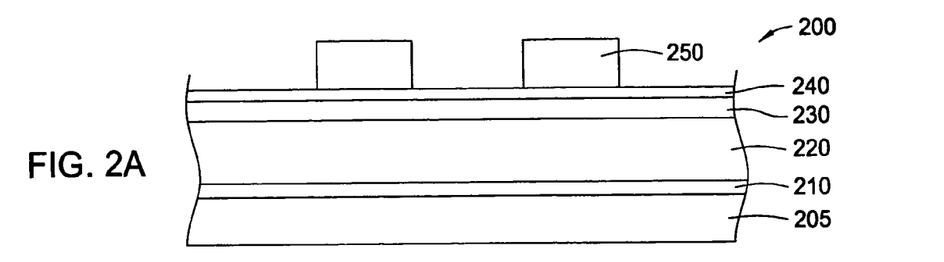
FIGS. 2A-2E are cross sectional views showing one embodiment of a deposition sequence of the invention.

As shown in FIG. 2A, an optional barrier layer 210 is deposited on the substrate surface to eliminate inter-level diffusion between the substrate 200 and subsequently deposited material. The substrate surface 205 may comprise a dielectric or conductive material, and while not shown, the substrate surface 205 may comprise metal features formed in a dielectric material. The barrier layer 210 may be deposited to a thickness of about 100 Å to about 1000 Å.

The barrier layer 210 may comprise any conventional barrier layer material including, for example, silicon nitride, silicon oxynitride, or combinations thereof. The barrier layer may also include a low dielectric constant material, such as silicon carbide or nitrogen containing silicon carbide having a dielectric constant of about 5 or less. An example of a low k material is BLOk™ dielectric material commercially available from Applied Materials, Inc., of Santa Clara, Calif.

A dielectric material layer 220 is deposited on the barrier layer 210. The dielectric material layer may include silicon oxide-based materials for use in, for example, shallow trench isolation (STI) deposition processes. Examples of dielectric material include silicon oxides, doped silicon oxides, such as PSG, PBSG, and carbon doped silicon oxides as examples. An example of a low k material is Black Diamond™ dielectric material commercially available from Applied Materials, Inc., of Santa Clara, Calif.

An amorphous carbon layer 230 is then deposited on the dielectric material layer 220. Typically, the amorphous carbon layer has a thickness in the range of about 50 Å to about 1000 Å. The amorphous carbon layer 230 is a hardmask which may perform as a stop for chemical mechanical polishing techniques to allow selective removal of materials while protecting underlying materials, such as the dielectric material layer 220, from damage during etching or from polishing methods.

The amorphous carbon layer 230 may also perform as an etch stop and allow for selective removal of the underlying dielectric material and/or as an anti-reflective coating. The light absorption coefficient, k, of the amorphous carbon layer can be varied between about 0.1 to about 1.0 at wavelengths below about 250 nm, such as between about 193 nm and about 250 nm, making the amorphous carbon layer suitable for use as an anti-reflective coating (ARC) at DUV wavelengths. Typically, the amorphous carbon layer 230 has a thickness of about 200 Å to about 1100 Å.

Optionally, an anti-reflective coating 240 may be deposited on the amorphous carbon layer 230. The anti-reflective coating may comprise a material selected from the group consisting of an oxide, nitride, silicon oxynitride, silicon carbide, amorphous silicon, and combinations thereof. The anti-reflective coating 240 may function as a hardmask for the amorphous carbon layer 230 when the pattern is transferred therein.

Alternatively, the anti-reflective coating 240 may comprise another amorphous carbon layer. If the anti-reflective coating 240 is an amorphous carbon layer, the amorphous carbon bi-layer may include a first amorphous carbon layer 230 according to the process parameters described above and is designed primarily for light absorption. As such, the first amorphous carbon layer 230 has an index of refraction in the range of about 1.5 to about 1.9 and an absorption coefficient (k) in the range of about 0.5 to about 1.0 at wavelengths less than about 250 nm. The thickness of the first amorphous carbon layer 230 is variable depending on the specific stage of processing. Typically, the first amorphous carbon layer 230 has a thickness in the range of about 300 Å to about 1500 Å.

A second amorphous carbon layer, the anti-reflective coating layer 240, is formed on the first amorphous carbon layer 230 according to the process parameters described above to have an index of refraction between about 1.5 and about 1.9, and an absorption coefficient between about 0.1 and about 0.5. The second amorphous carbon layer is designed primarily for phase shift cancellation by creating reflections that cancel those generated at the interface with an overlying material layer, such as an energy sensitive resist material, for example, a resist. The thickness of the second amorphous carbon layer is also variable depending on the specific stage of processing, for example, between about 300 Å and about 700 Å. The refractive index (n) and the absorption coefficient (k) of the first and second amorphous carbon layers are tunable, in that they can be varied as a function of the temperature as well as the composition of the gas mixture during layer formation.

An energy resist material, such as a resist material 250, is deposited and patterned on the surface of the amorphous carbon material. The resist material 250 can be spin coated on the substrate to a thickness within the range of about 200 Å to about 6000 Å. Photoresist materials are sensitive to ultraviolet (UV) radiation having a wavelength less than about 450 nm. DUV resist materials are sensitive to UV radiation having wavelengths of 245 nm or 193 nm. An image of a pattern is introduced into the layer of resist material 250 by exposure to UV radiation via a photolithographic reticle. The image of the pattern introduced in the layer of resist material 250 is developed in an appropriate developer to define the pattern as shown in FIG. 2A.

Figure 2B:
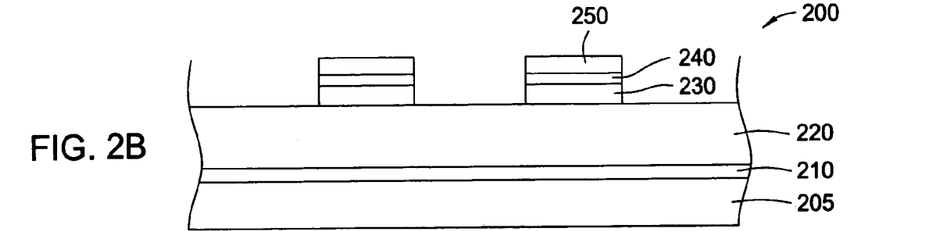
Figure 2C:
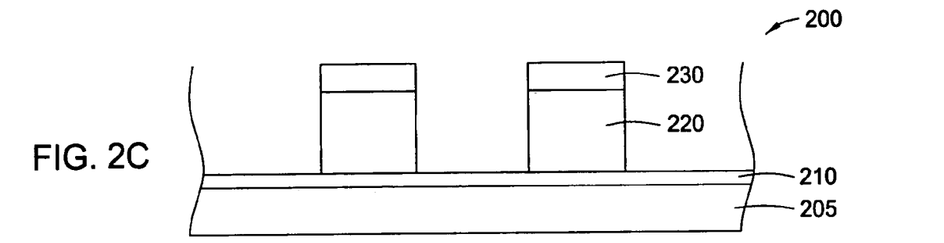

The pattern defined in the resist material 250 is transferred through the amorphous carbon layer 230 and any intervening, layer, such as anti-reflective coating 240 as shown in FIG. 2B. The pattern is transferred through the amorphous carbon layer 230 and any intervening layer by etching using an appropriate chemical etchant. For example, ozone, oxygen or ammonia plasmas may be used to etch amorphous carbon materials. Multiple etching steps including variable etching gas composition may be use to etch through the amorphous carbon layer 230 and any intervening layer. Optionally, any remaining resist material after the etching process may be removed prior to further processing.

Figure 2D:
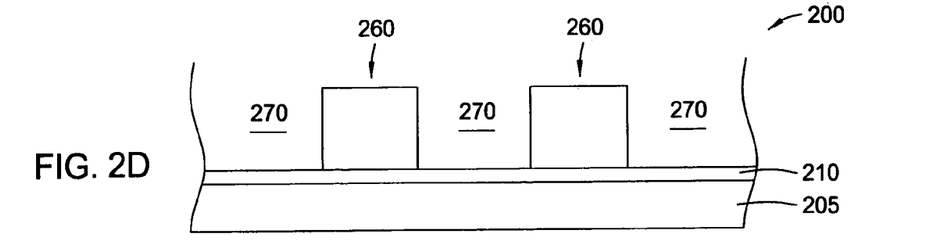

The pattern formed in the amorphous carbon layer 230 may then be transferred to the dielectric material layer 220 and any intervening layer by etching using an appropriate chemical etchant to form features 260 as shown in FIG. 2D. Any known conductive material etchant may be used to etch the conductive material 120.

The amorphous carbon layer 230 may then be exposed to a plasma of a hydrogen-containing gas to remove the amorphous containing material from the surface of the substrate. An example of the hydrogen-containing plasma removal process may be performed by introducing hydrogen gas at a flow rate of about 1000 sccm, maintaining a chamber pressure of about 5 Torr, maintaining a substrate temperature at about 250° C., generating a plasma by supplying a RF power level of between about 100 W and about 300 W for a 200 mm substrate, and maintaining the plasma for about 60 seconds, or as necessary to remove the amorphous carbon material. The gas distributor is positioned about 500 mils from the substrate surface during the plasma treatment as shown in FIG. 2D. Any remaining intervening materials, such as the ARC material, are removed by the etchant or by the amorphous carbon removal process. The invention contemplates that a separate removal process for the ARC layer may be necessary to remove such layer residues prior to amorphous carbon removal.

Conductive features may then be formed in the feature definitions 270 between the features 260 by bulk deposition. The conductive material may comprise a metal, such as aluminum, tungsten, or copper, or other conductive material, such as polysilicon, and may include metal silicides, such as tungsten silicide. The conductive material may be deposited by, for example, chemical vapor deposition, including atomic layer deposition techniques, physical vapor deposition, including high density physical vapor deposition techniques, electrochemical-deposition, including electroplating and electroless deposition techniques, or a combination of deposition techniques. The conductive material may also be deposited to a thickness between about 2,000 Å and about 4,000 Å, and may vary in thickness depending on the size of the structure to be fabricated.

Figure 2E:
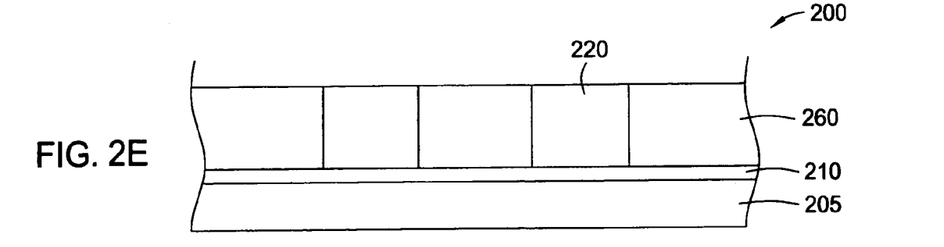

Dielectric materials including low k dielectric material may be also deposited in the feature definitions 270 as shown in FIG. 2E. An example of a gap-fill process with low k dielectric material is disclosed in U.S. patent Ser. No. 6,054, 379, issued Apr. 25, 2000, which is incorporated herein by reference to the extent not inconsistent with the disclosure and claimed aspects herein. The gap fill deposition of a dielectric material, such as silicon oxide and silicon oxide-based materials, may be used for shallow trench isolation (STI) deposition processes. The dielectric material may also be deposited to a thickness between about 2,000 Å and about 4,000 Å, and may vary in thickness depending on the size of the structure to be fabricated.

Deposition of a Dual Damascene Structure

An example of a damascene structure that is formed using the low k dielectric silicon, oxygen, and carbon material, the amorphous carbon material, and the amorphous carbon material removal process described herein is shown in FIGS. 3A-3G, which are cross sectional views of a substrate having the steps of the invention formed thereon.

Figure 3A:
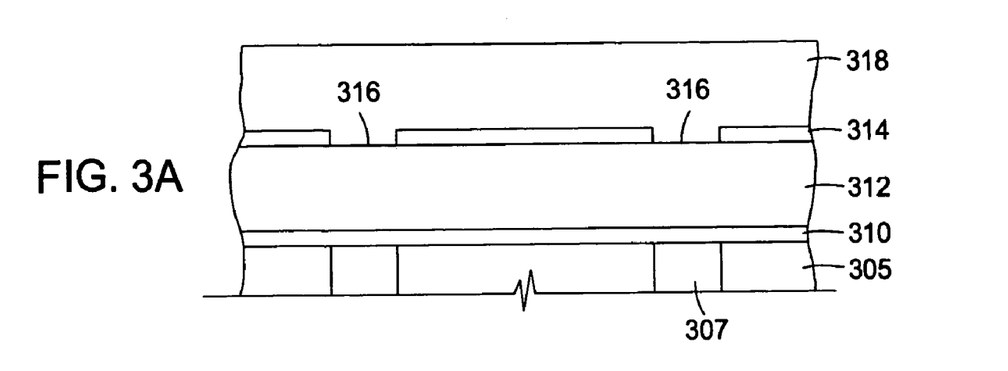
FIGS. 3A-3G are cross sectional views showing one embodiment of a dual damascene deposition sequence of the invention.

As shown in FIG. 3A, a silicon carbide barrier layer 310 is deposited on the substrate surface to eliminate inter-level diffusion between the substrate and subsequently deposited material. The substrate surface may comprise metal features 307 formed in a dielectric material 305. The silicon carbide barrier layer 310 may be doped with oxygen, boron, phosphorus, or combinations thereof.

A first dielectric layer 312, comprising silicon, oxygen, and carbon, as described herein is deposited on the silicon carbide barrier layer 310 on the substrate surface including metal features 307 formed in a dielectric material 305 The first dielectric layer 312 of interlayer dielectric material is deposited on the first silicon carbide barrier layer 310 by oxidizing an organosilane or organosiloxane, such as trimethylsilane, to a thickness of about 5,000 to about 15,000 Å, depending on the size of the structure to be fabricated.

An example of a low dielectric constant material that may be used as an interlayer dielectric material is Black Diamond™ dielectric material commercially available from Applied Materials, Inc., of Santa Clara, Calif. Alternatively, the first dielectric layer may also comprise other low k dielectric material such as a low k polymer material including paralyne or a low k spin-on glass such as un-doped silicon glass (USG) or fluorine-doped silicon glass (FSG). A plasma process following deposition as described herein for the silicon oxycarbide layer may then treat the first dielectric layer 312. An example of a low k dielectric contant layer and amorphous carbon layer stack is further disclosed in U.S. Pat. No. 6,541,397, issued Apr. 1, 2004, which is incorporated herein by reference to the extent not inconsistent with the disclosure and claimed aspects herein.

A low k etch stop (or second barrier layer) 314 of a silicon carbide material or oxidized organo silane layer is then deposited on the first dielectric layer 312 to a thickness of about 200 to about 1000 Å. Alternatively, the etch stop 314 may be a nitrogen containing silicon carbide material. The low k etch, stop 314 is then pattern etched to define the contact/via openings 316 and to expose first dielectric layer 312 in the areas where the contacts/vias are to be formed as shown in FIG. 3A. Preferably, the low k etch stop 314 is pattern etched using conventional photolithography and etch processes using fluorine, carbon, and oxygen ions. While not shown, a nitrogen-free silicon carbide or silicon oxide cap layer between about 100 Å and about 500 Å thick may be deposited on the etch stop 314 prior to depositing further materials.

After the low k etch stop 314 has been etched to pattern the contacts/vias and the photoresist has been removed, a second dielectric layer 318 of silicon oxycarbide as described herein is, deposited to a thickness of about 5,000 to about 15,000 Å as shown in. FIG. 3A. The second dielectric layer 318 may also be plasma treated as described herein for the silicon oxycarbide layer.

In an alternative embodiment, a nitrogen-free silicon carbide or silicon oxide cap layer between about 100 Å and about 500 Å thick may be deposited on second dielectric layer 318 prior to depositing additional materials, such as photoresist materials. In a further alternative embodiment, a silicon carbide cap layer (not shown) may be deposited on the second dielectric layer 318 prior to depositing additional materials, such as photoresist materials.

Figure 3B:
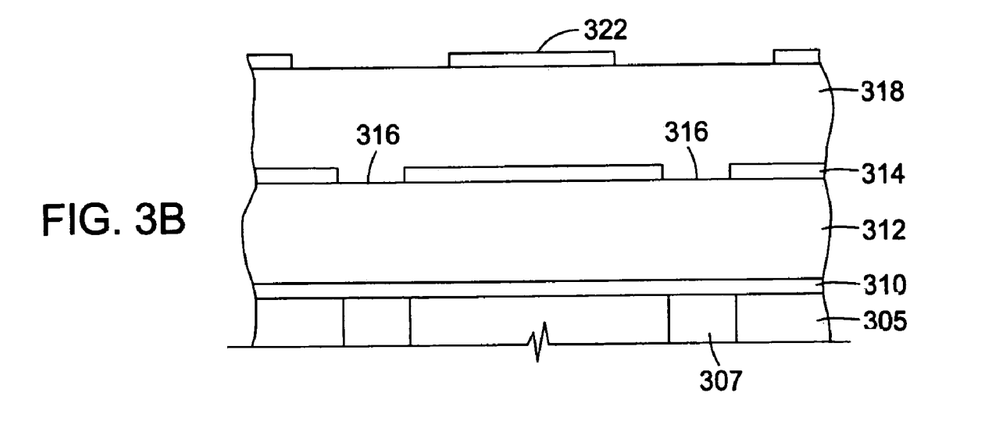

An amorphous carbon layer 322 is then deposited on the second dielectric layer 318 (or cap layer) and patterned preferably using conventional photolithography processes to define the interconnect lines 320 as shown in FIG. 3B. The amorphous carbon layer 322 is deposited as described herein. Typically, the amorphous carbon layer has a thickness in the range of about 50 Å to about 1000 Å.

The amorphous carbon layer 322 is a hardmask which may perform as a stop for chemical mechanical polishing techniques to allow removal of conductive material while protecting low k dielectric materials, such as the second dielectric layer 318, from damage during etching or from polishing methods. The amorphous carbon layer 322 may also function as an anti-reflective coating in addition to the hardmask. Further multiple layers of amorphous carbon may be used for the amorphous carbon layer 322. For example, the amorphous carbon bilayer ARC layer described herein may be used as the amorphous carbon layer 322.

Figure 3C:
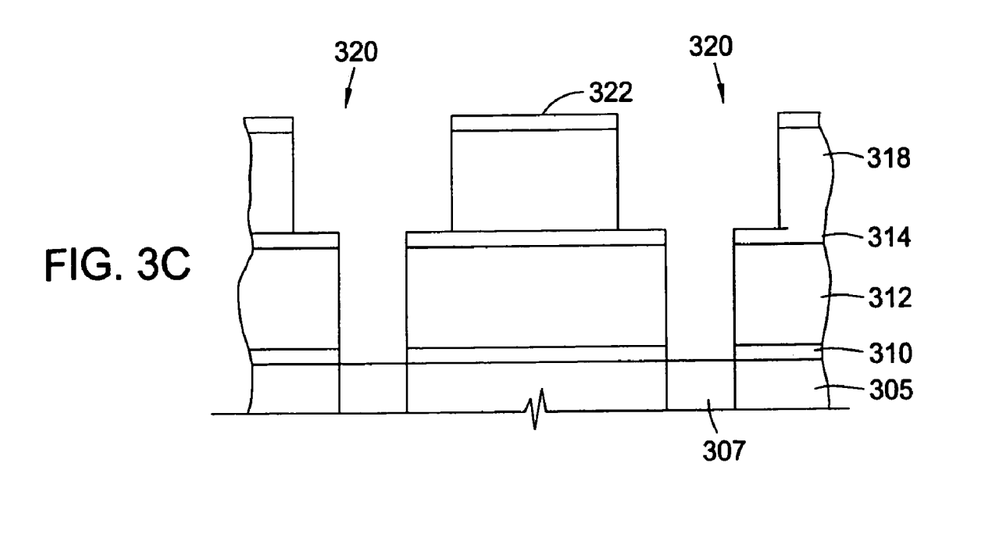

The features are then etched through the second dielectric layer 318, the low k etch stop 314, the first dielectric layer 312, and the silicon carbide barrier layer 310 as shown in FIG. 3C. The amorphous carbon layer has a selectivity, or removal rate ratio, to dielectric material as deposited underlying, of greater than about 1:10, such as between about greater than 1:10 and about 1:20, and can include removal rate ratios of greater than 1:30.

Figure 3D:
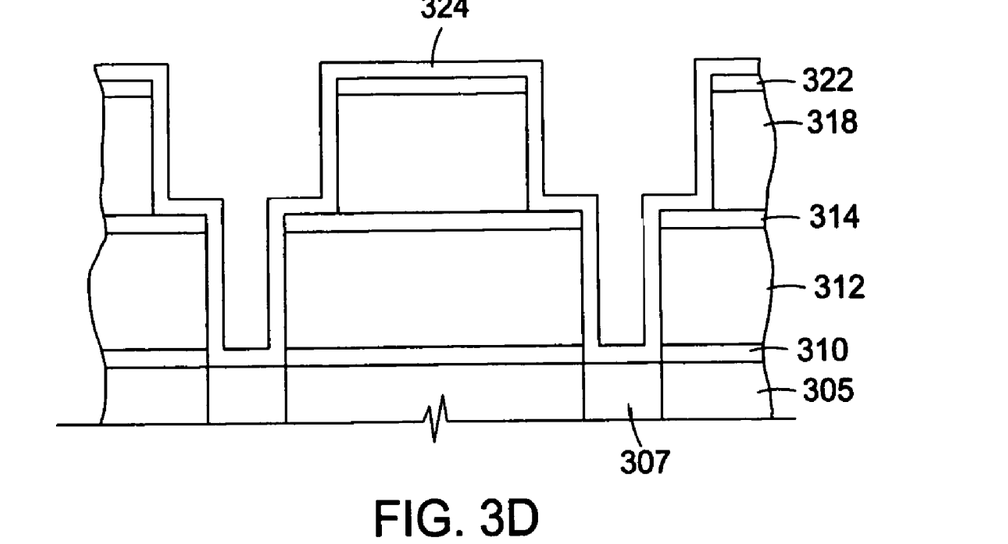
Figure 3E:
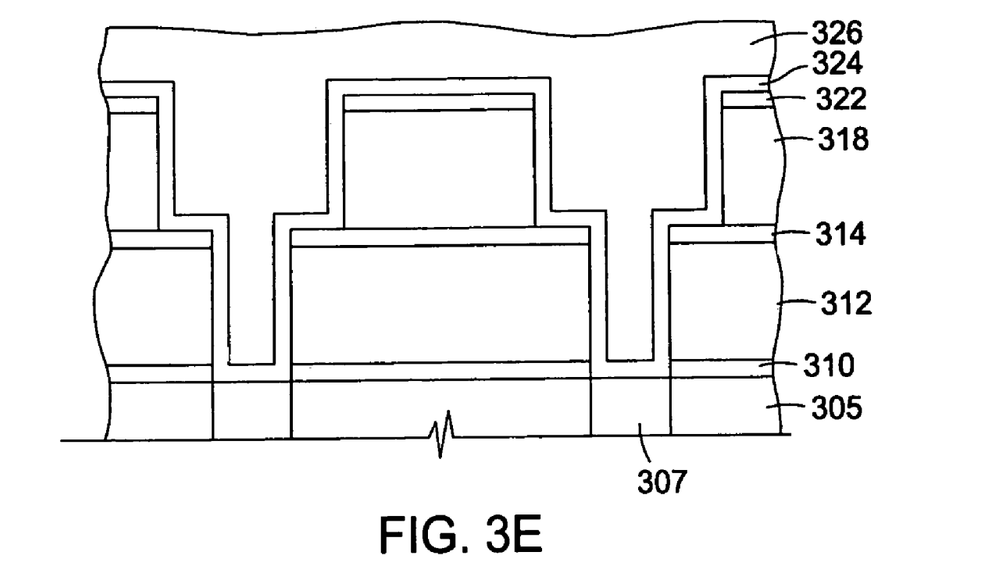

The interconnect lines 320 are filled to form a metallization structure with a conductive material such as aluminum, copper, tungsten or combinations thereof. Presently, the trend is to use copper to form the smaller features due to the low resistivity of copper (1.7 mW-cm compared to 3.1 mW-cm for aluminum). Preferably, as shown in FIG. 3D, a suitable barrier layer 324 such as tantalum or tantalum nitride is first deposited conformally in the metallization pattern to prevent copper migration into the surrounding silicon and/or dielectric material. Thereafter, copper 326 is deposited using either chemical vapor deposition, physical vapor deposition, electroplating, or combinations thereof to fill the structure as shown in FIG. 3E.

Figure 3F:
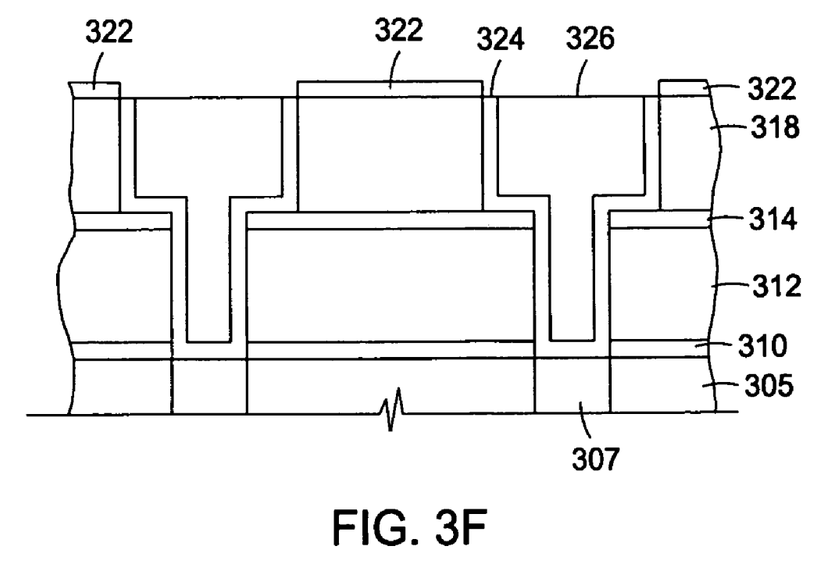

Once the structure has been filled with copper or other metal, the surface is planarized using chemical mechanical polishing to remove any excess copper 326 and barrier layer 324 materials. However, the polishing resistant amorphous carbon layer 322 remains behind after the polishing process as shown in FIG. 3F. The amorphous carbon layer has a selectivity, or removal rate ratio, of conductive material, either copper or barrier layer materials, to amorphous carbon of greater than about 1:1, such as between about 5:1 and about 30:1, and can include removal rate ratios of greater than 30:1.

Figure 3G:
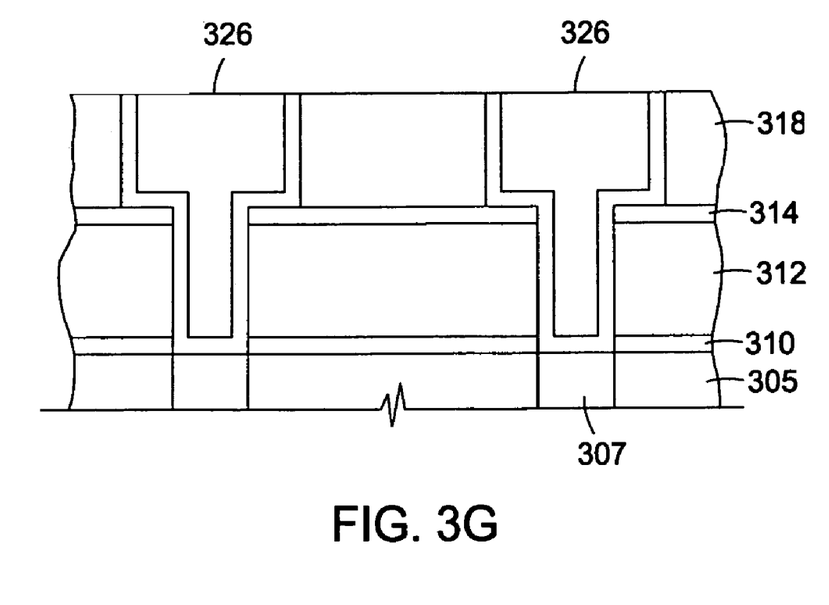

The amorphous carbon layer 322 is then exposed to a plasma of a hydrogen-containing gas to remove the amorphous containing material from the surface of the substrate. An example of the hydrogen-containing plasma removal process may be performed by introducing hydrogen gas at a flow rate of about 1000 sccm, maintaining a chamber pressure of about 5 Torr, maintaining a substrate temperature at about 250° C., generating a plasma by supplying a RF power level of between about 100 W and about 300 W for a 200 mm substrate, and maintaining the plasma for about 60 seconds, or as necessary to remove the amorphous carbon material. The gas distributor is positioned about 500 mils from the substrate surface during the plasma treatment.

EXAMPLES

The following examples demonstrate various embodiments of the adhesion processes described herein as compared to a standard interlayer stack to illustrate the improved interlayer adhesion. The samples were undertaken using a chemical vapor deposition chamber, and in dual processing station Producer™ 200 mm and 300 mm processing chambers, which includes a solid-state dual frequency RF matching unit with a two-piece quartz process kit, both fabricated and sold by Applied Materials, Inc., Santa Clara, Calif.

Amorphous carbon films were deposited as follows. An amorphous carbon layer was deposited with a single frequency and helium carrier gas by introducing propylene, $C_3H_6$, at a flow rate of about 1000 sccm and helium at a flow rate of about 650 sccm, optionally maintaining the chamber at a substrate temperature of about 350° C., maintaining a chamber pressure of about 7 Torr, positioning a gas distributor at about 240 mils from the substrate surface, and applying a RF power of about 700 watts at about 13.56 MHz. The deposited process was observed to have a deposition rate of about 1874 A/min, an n value of about 1.648, and an optical k value of about 0.342.

An amorphous carbon layer was deposited with a single frequency and argon carrier gas by introducing propylene, $C_3H_6$, at a flow rate of about 1000 sccm and argon at a flow rate of about 1200 sccm, optionally maintaining the chamber at a substrate temperature of about 350° C., maintaining a chamber pressure of about 7 Torr, positioning a gas distributor at about 240 mils from the substrate surface, and applying a RF power of about 700 watts at about 13.56 MHz. The deposited process was observed to have a deposition rate of about 3320 A/min, an n value of about 1.631, and an optical k value of about 0.348.

An amorphous carbon layer was deposited with a dual frequency and argon carrier gas by introducing propylene, $C_3H_6$, at a flow rate of about 1000 sccm and argon at a flow rate of about 1200 sccm, optionally maintaining the chamber at a substrate temperature of about 350° C., maintaining a chamber pressure of about 7 Torr, positioning a gas distributor at about 240 mils from the substrate surface, and applying a RF power of about 700 watts at about 13.56 MHz and about 100 watts at about 350 KHz. The deposited process was observed to have a deposition rate of about 4032 A/min, an n value of about 1.618, and an optical k value of about 0.365. The deposited layer was observed to have an etch selectivity improvement of between about 5% and about 20% greater than helium deposited amorphous carbon materials with a single high frequency.

A high deposition rate amorphous carbon layer was deposited with a single frequency and argon and helium carrier gas by introducing propylene, $C_3H_6$, at a flow rate of about 650 sccm, argon at a flow rate of about 1450 sccm, and helium at a flow rate of about 500 sccm, optionally maintaining the chamber at a substrate temperature of about 400° C., maintaining a chamber pressure of about 10 Torr, positioning a gas distributor at about 210 mils from the substrate surface, and applying a RF power of about 715 watts at about 13.56 MHz. The deposited process was observed to have a deposition rate of about 4,000 A/min compared to about 800 A/min for a process only using a helium carrier gas.

It is also believed that the amorphous carbon films deposited herein with Ar gas and mixed High and low frequency power have greater deposition rates, which deposition rates may be up to about 2 to about 5 times greater, with a lower pinhole density, a higher film hardness, and more desirable optical properties, such as transparency and including more desirable ARC properties as described herein.

While the foregoing is directed to preferred embodiments of the present invention, other and further embodiments of the invention may be devised without departing from the basic scope thereof, and the scope thereof is determined by the claims that follow.

What is claimed is:

1. A method for processing a substrate in a processing chamber, comprising:
   forming a dielectric material layer on a surface of the substrate;
   depositing one or more amorphous carbon layers consisting essentially of hydrogen and carbon on the dielectric material layer by a process comprising:
      introducing a processing gas comprising one or more hydrocarbon compounds without containing silicon and an argon carrier gas;
      generating a plasma of the processing gas by applying power from a dual-frequency RE source;
   etching the one or more amorphous carbon layers to form a patterned amorphous carbon layer;
   etching feature definitions in the dielectric material layer corresponding to the patterned one or more amorphous carbon layers;
   depositing an anti-reflective coating on the one or more amorphous carbon layers;
   depositing and patterning resist material on the anti-reflective coating; and
   etching the anti-reflective coating prior to or concurrent with etching the one or more amorphous carbon layers.

2. The method of claim 1, further comprising removing the resist material prior to etching feature definitions in the dielectric layer.

3. The method of claim 1, further comprising:
   removing the one or more amorphous carbon layers; and
   depositing a conductive material on the surface of the substrate.

4. The method of claim 1, wherein the hydrocarbon compound has the general formula $C_xH_y$, wherein x has a range of 2 to 4 and y has a range of 2 to 10.

5. The method of claim 4, wherein the one or more hydrocarbon compounds are selected from the group consisting of propylene ($C_3H_6$), propyne ($C_3H_4$), propane ($C_3H_8$), butane ($C_4H_{10}$), butylene ($C_4H_8$), butadiene ($C_4H_6$), acetelyne ($C_2H_2$), and combinations thereof.

6. The method of claim 1, wherein the generating the plasma comprises applying a first RF power at a first frequency and applying a second RF power at a second frequency less than the first frequency.

7. The method of claim 6, wherein the generating the plasma comprises applying a first RE power between at a first frequency between about 10 Mhz and about 30 Mhz applying a second RE power at a second frequency between about 100 kHz and about 500 KHz.

8. The method of claim 1, wherein the ratio of second RE power to first RE power is less than about 0.6:1.

9. The method of claim 1, wherein at least one of the one or more amorphous carbon layers comprise an anti-reflective coating.

10. The method of claim 1, wherein the anti-reflective coating is a material selected from the group of silicon nitride, silicon carbide, carbon-doped silicon oxide amorphous carbon, and combinations thereof.

11. The method of claim 1, further comprising depositing a barrier layer prior to depositing the dielectric material.

12. The method of claim 1, wherein the etch selectivity of amorphous carbon to the dielectric material is greater than about 1:10.

13. The method of claim 1, further comprising removing the amorphous carbon layer from the substrate using a hydrogen-containing plasma, an oxygen-containing plasma, or combination thereof.

14. A method for processing a substrate, comprising:
depositing one or more dielectric layers on a substrate surface, wherein the one or more dielectric layers comprise silicon, oxygen, and carbon and has a dielectric constant of about 3 or less;
forming one or more amorphous carbon layers consisting essentially of hydrogen and carbon on the one or more dielectric layers by a process comprising:
introducing a processing gas comprising one or more hydrocarbon compounds without containing silicon and an argon carrier gas;
generating a plasma of the processing gas by applying power from a dual-frequency RF source;
defining a pattern in at least one region of the one or more amorphous carbon layers;
forming feature definitions in the one or more dielectric layers by the pattern formed in the at least one region of the one or more amorphous carbon layers;
depositing one or more conductive materials in the feature definitions;
depositing an anti-reflective coating on the one or more amorphous carbon layers;
depositing and patterning resist material on the anti-reflective coating; and
etching the anti-reflective coating prior to or concurrent with etching the one or more amorphous carbon layers.

15. The method of claim 14, wherein at least one of the one or more amorphous carbon layers comprise an anti-reflective coating.

16. The method of claim 14, further comprising removing the one or more amorphous carbon layers by exposing the one or more amorphous carbon layers to a plasma of a hydrogen-containing gas prior to depositing one or more conductive materials in the feature definitions.

17. The method of claim 16, wherein the hydrogen-containing gas comprises a gas selected from the group of hydrogen, ammonia, water vapor, and combinations thereof.

18. The method of claim 16, wherein the plasma is generated by applying a power level between about 0.15 watts/cm$^2$ and about 5 watts/cm$_2$ to the chamber between for between about 10 seconds and about 120 seconds.

19. The method of claim 14, further comprising:
polishing the one or more conductive materials and stopping on the one or more amorphous carbon layers; and
removing the one or more amorphous carbon layers by exposing the one or more amorphous carbon layers to a plasma of a hydrogen-containing gas.

20. The method of claim 14, wherein the hydrocarbon compound has the general formula $C_xH_y$, wherein x has a range of 2 to 4 and y has a range of 2 to 10.

21. The method of claim 20, wherein the one or more hydrocarbon compounds are selected from the group consisting of propylene ($C_3H_6$), propyne ($C_3H_4$), propane ($C_3H_8$), butane ($C_4H_{10}$), butylene ($C_4H_8$), butadiene ($C_4H_6$), acetelyne ($C_2H_2$), and combinations thereof.

22. The method of claim 20, wherein the one or more hydrocarbon compounds further comprises one or more fluorinated derivatives of the one or more hydrocarbon compounds.

23. The method of claim 14, wherein the generating the plasma comprises applying a first RF power at a first frequency and applying a second RF power at a second frequency less than the first frequency.

24. The method of claim 23, wherein the generating the plasma comprises applying a first RF power between at a first frequency between about 10 Mhz and about 30 Mhz applying a second RE power at a second frequency between about 100 kHz and about 500 KHz.

25. The method of claim 23, wherein the ratio of second RF power to first RF power is less than about 0.6:1.

26. The method of claim 14, wherein the anti-reflective coating is a material selected from the group of silicon nitride, silicon carbide, carbon-doped silicon oxide, amorphous carbon, and combinations thereof.

27. The method of claim 14, further comprising depositing a barrier layer prior to depositing the at least one dielectric material.

28. The method of claim 14, wherein the etch selectivity of amorphous carbon to the dielectric material is greater than about 1:10.

* * * * *

UNITED STATES PATENT AND TRADEMARK OFFICE
CERTIFICATE OF CORRECTION

PATENT NO. : 7,638,440 B2 Page 1 of 1
APPLICATION NO. : 10/799146
DATED : December 29, 2009
INVENTOR(S) : Wang et al.

It is certified that error appears in the above-identified patent and that said Letters Patent is hereby corrected as shown below:

In the Background of the Disclosure:
Column 2, Lines 30-31, please delete "siuicides" and insert --silicides-- therefor;

In the Detailed Description of the Preferred Embodiments:
Column 5, Line 28, please delete "Asymmietric" and insert --Asymmetric-- therefor;

In the Claims:
Column 14, Claim 1, Line 34, please delete "RE" and insert --RF-- therefor;

Column 14, Claim 7, Line 67, please delete "RE" and insert --RF-- therefor;

Column 15, Claim 7, Line 2, please delete "RE" and insert --RF-- therefor;

Column 15, Claim 8, Line 4, please delete "RE" and insert --RF-- therefor;

Column 15, Claim 8, Line 5, please delete "RE" and insert --RF-- therefor;

Column 16, Claim 24, Line 36, please delete "RE" and insert --RF-- therefor.

Signed and Sealed this

Ninth Day of February, 2010

David J. Kappos
*Director of the United States Patent and Trademark Office*